United States Patent
Yamaguchi et al.

(10) Patent No.: US 7,863,948 B2
(45) Date of Patent: Jan. 4, 2011

(54) CLOCK FREQUENCY DIVIDING CIRCUIT

(75) Inventors: Hisakatsu Yamaguchi, Kawasaki (JP); Kouichi Kanda, Kawasaki (JP); Junji Ogawa, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 120 days.

(21) Appl. No.: 12/199,168

(22) Filed: Aug. 27, 2008

(65) Prior Publication Data

US 2009/0027091 A1 Jan. 29, 2009

Related U.S. Application Data

(63) Continuation of application No. PCT/JP2006/303701, filed on Feb. 28, 2006.

(51) Int. Cl.
*H03B 19/00* (2006.01)

(52) U.S. Cl. .............. 327/117; 327/115; 327/202; 327/203

(58) Field of Classification Search .............. 327/117, 327/118
See application file for complete search history.

(56) References Cited

U.S. PATENT DOCUMENTS 7,304,519 B2 * 12/2007 Neubauer ............... 327/203
2006/0208776 A1 * 9/2006 Tonietto et al. ............ 327/117

FOREIGN PATENT DOCUMENTS

JP 05-347554 A 12/1993

OTHER PUBLICATIONS

Hamid R. Rategh et al., A CMOS Frequency Synthesizer with an Injection-Locked Frequency Divider for 5-GHz Wireless LAN Receiver, IEEE Journal on Solid-State Circuits, vol. 35, No. 5, May 2000, pp. 780-781.
A. Mazzanti et al., Injection Locking LC Dividers for low Power Quadrature Generation, IEEE 2003 Custom Integrated Circuits Conference, pp. 563-566.

* cited by examiner

*Primary Examiner*—Lincoln Donovan
*Assistant Examiner*—John W Poos
(74) *Attorney, Agent, or Firm*—Fujitsu Patent Center (57) ABSTRACT

A first frequency dividing circuit and a second frequency dividing circuit are provided, and these circuits frequency-divide two-phase external clocks injected from an external part, to output four-phase clocks with phase guarantee. Each of the frequency dividing circuits includes a mixer, an adding circuit, and a phase circuit. The first frequency dividing circuit and the second frequency dividing circuit are coupled in loop shape via a first coupling circuit and a second coupling circuit. The first coupling circuit receives a first output signal of the first frequency dividing circuit to output a second external input signal to the second frequency dividing circuit, and the second coupling circuit receives a second output signal of the second frequency dividing circuit to output a first external input signal to the first frequency dividing circuit, and a clock frequency dividing circuit with a high loop gain and a wide lock range can be realized.

6 Claims, 8 Drawing Sheets

CLOCK FREQUENCY DIVIDING CIRCUIT

CROSS-REFERENCE TO RELATED APPLICATION

This application is a Continuation Application of International Application No. PCT/JP2006/303701, filed Feb. 28, 2006, designating the U.S., the entire contents of which are incorporated herein by reference.

BACKGROUND

1. Field

The present embodiments relate to a clock frequency dividing circuit generating clocks, and realizing a wide lock range and phase guarantee.

2. Description of the Related Art

In computer and communication fields, an amount of data processed has been recently increasing. In order to cope with the tendency toward an increase in data amount, an operation speed of Large Scale Integrated circuit (LSI) is becoming higher and a data transmission speed between LSIs is becoming higher.

Such speed-up and higher performance of communication and information processing devices are creating a demand for a transmission circuit transmitting/receiving high bit-rate signals and an operation circuit with high throughput. As a result, timing conditions imposed on clocks used in analog circuits and digital circuits realizing high-speed operation are becoming stricter.

As a typical clock frequency dividing circuit, a flip-flop (FF) circuit is known. A clock frequency dividing circuit using a FF circuit outputs a frequency dividing clock which synchronizes with an input clock when the input clock displaces. Generally, a frequency dividing circuit using a FF has a wideband characteristic and is often used in fields of relatively low frequencies of less than several GHz (see, for example, Japanese Unexamined Patent Application Publication No. H05-347554).

Further, in fields of a high frequency band ranging from several GHz to several tens GHz, there has been known a clock frequency dividing circuit using an injection lock technique which synchronizes an output clock of the frequency dividing circuit with its input clock. For example, in a document (A. Mazzanti, P. Uggetti and F. Svelto, "Analysis and Design of Injection-Locked LC Dividers for Quadrature Generation" IEEEJ. Solid-State Circuits, vol. 39, pp. 1425-1432, September 2004), a clock frequency circuit using the injection lock technique includes a LC oscillator made up of a coil (L) and a capacitor (C). Since a clock whose oscillation frequency is determined by values of L and C irrespective of an input clock (self-oscillation clock) is output, a frequency dividing clock synchronizing with the input clock is output by using the injection lock technique. The application of such a clock frequency dividing circuit in fields of a high frequency band ranging from several GHz to several tens GHz is expected, though it has a narrow band characteristic.

Generally, power consumption and output phase noise of a frequency dividing circuit using the injection lock technique are smaller than those of a frequency dividing circuit using a FF circuit. The reason for the low power consumption is that power consumption of a LC oscillator depends on power loss of a resistance component of the LC oscillator and this power loss is smaller than electrical charge and discharge in the FF circuit. The reason for the small output phase noise is its narrow band characteristic.

However, in the application in relatively low frequencies of less than several GHz, a required clock frequency is less than several GHz, and the use of the injection lock technique requires large values of L and C of the LC oscillator, which poses various problems in terms of size, cost, and the like. For this reason, a frequency dividing circuit using the injection lock technique has not been in wide use for a lower frequency band.

However, in accordance with the recent increase in throughput, high frequencies such as several GHz and several tens GHz have come into use, and the injection lock technique has been drawing attention as a technique realizing the generation and transmission of high-accuracy clocks.

In accordance with the recent speed-up and higher performance, timing restrictions imposed on clocks are becoming stricter. In particular, an increase in scale of LSI necessitates distribution of high-speed and high-accuracy clocks to various parts in the chip. However, in a conventional typical frequency dividing circuit using a FF circuit, it is difficult to reduce power consumption and output phase noise and so on.

A frequency dividing circuit using the injection lock technique, though drawing attention because of its small power consumption and output phase noise, has a problem of insufficient followability with input clocks in a wide frequency range because of its narrow band characteristic. A frequency dividing circuit using the injection lock technique is narrow in lock range which is a range of input clock frequencies with which its output clock can synchronize.

For example, when a clock output by a PLL is frequency-divided, there arises a problem that the lock range is not wide enough to cover a frequency range of the output clock of the PLL.

Thus, in using the injection lock technique realizing lower power consumption and small output phase noise, widening a lock range is a great problem to be solved for realizing its practical use.

Further, the frequency dividing circuit using the injection lock technique disclosed in the above-mentioned non-patent document has a problem that it is difficult to guarantee a phase relation of four-phase output clocks since the phase relation of the four-phase output clocks depends on an initial internal state and thus is not stable.

SUMMARY

According to an aspect of the embodiments, a first frequency dividing circuit and a second frequency dividing circuit are provided. The two frequency dividing circuits frequency-divide two-phase external clocks (a first external clock and a second external clock) injected from an external part to output four-phase clocks. The first frequency dividing circuit includes a first mixer, a first adding circuit, and a first phase circuit. The first mixer multiplies the first external clock injected from the external part and a first internal feedback signal fed back from the first phase circuit in this frequency dividing circuit. The first adding circuit adds an output signal of the first mixer and a first external input signal which is input from the second frequency dividing circuit via a second coupling circuit. The first phase circuit phase-shifts an output signal of the first adding circuit to output a first output signal and further to feed back the first internal feedback signal to the first mixer in the first frequency dividing circuit. The second frequency dividing circuit includes a second mixer, a second adding circuit, and a second phase circuit. Flows of signals in the respective parts are the same as those in the first frequency dividing circuit, but a second external clock input to the second mixer is different in phase from the first external clock. The second mixer multiplies the second external clock and a second internal feedback signal fed back from the second phase circuit in this frequency dividing circuit. The second adding circuit adds an output signal of the second mixer and a second external input signal which is input from the first frequency dividing circuit via a first coupling circuit. The second phase circuit phase-shifts an output signal of the second adding circuit to output a second output signal and further to feed back the second internal feedback signal to the second mixer in the second frequency dividing circuit.

DETAILED DESCRIPTION OF THE EMBODIMENTS

Before several embodiments of a clock frequency dividing circuit are described, techniques common to the embodiments will be hereinafter described.

Figure 1:
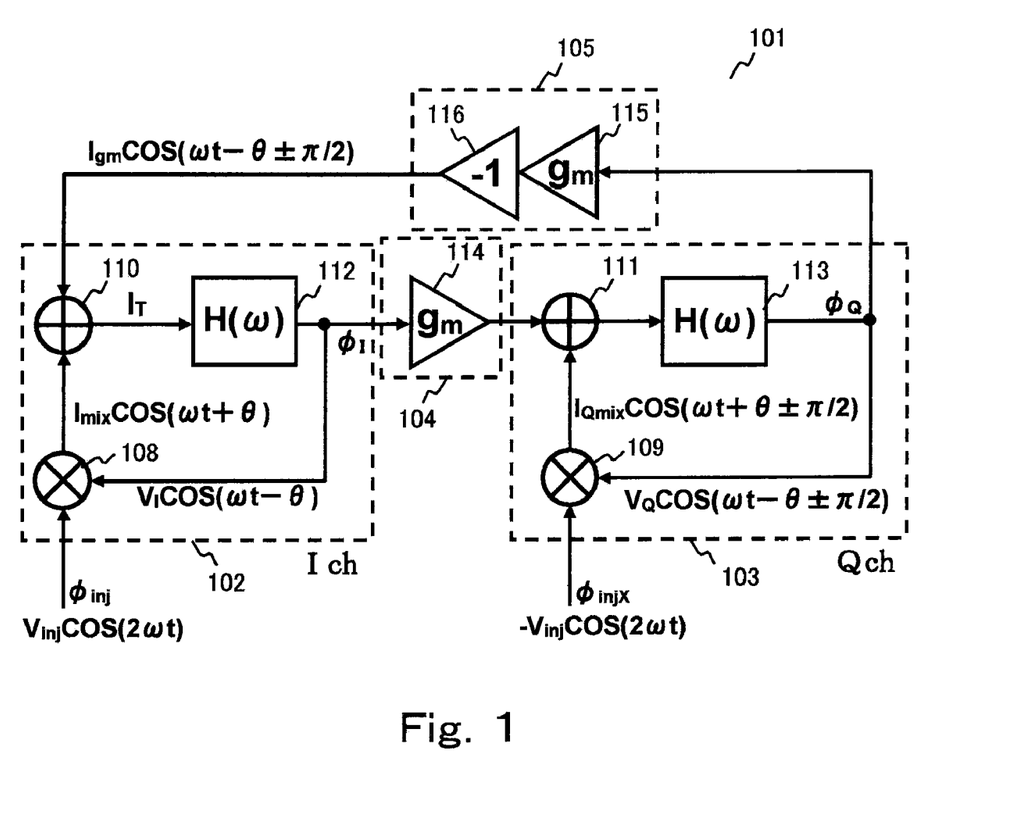
FIG. 1 is a block diagram of a clock frequency dividing circuit.

FIG. 1 is a block diagram of a clock frequency dividing circuit 101 according to the embodiments. The clock frequency dividing circuit 101 has two frequency dividing circuits, a first frequency dividing circuit 102 and a second frequency dividing circuit 103.

The first frequency dividing circuit 102 and the second frequency dividing circuit 103 are coupled to each other in loop shape via a first coupling circuit 104 which has a transconductance $g_m$ 114 and a second coupling circuit 105 which has a transconductance $g_m$ 115 and a reversing part 116. The transconductances $g_m$ 114 and 115 are amplifiers converting voltage to current with certain gains.

The first frequency dividing circuit 102 and the second frequency dividing circuit 103 receive two-phase external clocks $\phi_{inj}$ and $\phi_{injx}$ each with a frequency $2\omega$ which are injected from an external part, and generate four-phase clocks, that is, a clock $\phi_I$: ($V_I COS(\omega t - \theta)$) and a clock $\phi_Q$: ($V_Q COS(\omega t - \theta \pm \pi/2)$), which result from one-half frequency dividing of the external clocks $\phi_{inj}$ and $\phi_{injx}$, and clocks $\phi_{IX}$ and $\phi_{QX}$ which are complementary signals resulting from the inversion of the clocks $\phi_I$ and $\phi_Q$. The complementary signals, that is, the clocks $\phi_{IX}$ and $\phi_{QX}$ are inverted clocks of the clocks $\phi_I$ and $\phi_Q$ and are not shown here. Further, since FIG. 1 shows a single-ended structure, the clock $\phi_Q$ is coupled to the clock $\phi_{IX}$ which is the complementary signal, and the clock $\phi_{QX}$ which is the complementary signal is coupled to the clock $\phi_I$ after the clocks $\phi_Q$ and $\phi_{QX}$ are multiplied by −1 to be phase-shifted in a reversing part 116. This will be described in detail in a first embodiment.

The first frequency dividing circuit 102 and the second frequency dividing circuit 103 include mixers 108 and 109, adding circuits 110 and 111, and phase circuits 112 and 113, respectively.

Next, the operation of the first frequency dividing circuit 102 will be described. The external clock $\phi_{inj}$ is a clock with a voltage amplitude $V_{inj}$ and a frequency $2\omega$ input to the first frequency dividing circuit 102 and represented by $V_{inj} COS (2\omega t)$. Here, the external clock $\phi_{inj}$ corresponds to a first external clock.

The mixer 108 multiplies the external clock $\phi_{inj}$ and the clock $V_I COS(\omega t - \theta)$, which is a first internal feedback signal output by the phase circuit 112, to output, to the adding circuit 110, a clock represented by $I_{mix} COS(\omega t + \theta)$, with a current amplitude $I_{mix}$ and a frequency $\omega$. $\theta$ is a phase difference from the external clock $\phi_{inj}$.

The adding circuit 110 current-adds the output clock $I_{mix} COS(\omega t + \theta)$ of the mixer 108 and a first external input signal (a signal represented by $I_{gm} COS(\omega t - \theta + \pi/2)$ with a current amplitude $I_{gm}$ and a frequency $\omega$) output by the second coupling circuit 105, and outputs the resultant current $I_T$ to the phase circuit 112.

The phase circuit 112 feeds back the clock $V_I COS(\omega t - \theta)$ (first internal feedback signal), which results from the phase shift of the input current $I_T$, to the mixer 108, and further outputs this clock to the first coupling circuit 104 (first output signal).

Here, the input current $I_T$ of the phase circuit 112 is given by (Expression 1).

$$I_T = V_I \sqrt{(\beta V_{inj} g_m SIN(2\theta) + (\beta V_{inj})^2/4 + g_m^2)} \quad \text{(Expression 1)}$$

In the (Expression 1), $\beta$ represents a coefficient of transformation of the input voltage and the output current of the mixer 108 and its unit is A/V².

A loop gain at this time is given by (Expression 2), and a condition for the oscillation and locking is that the loop gain is higher than 1, and thus is given by (Expression 3).

$$\text{loop gain} = (I_T/V_I) * |H(\omega)| \quad \text{(Expression 2)}$$
$$= \sqrt{(\beta V_{inj} g_m SIN(2\theta) + (\beta V_{inj})^2/4 + g_m^2)} * |H(\omega)|$$

$$(I_T/V_I) * |H(\omega)| > 1 \quad \text{(Expression 3)}$$

The external clock $\phi_{injx}$ input to the second frequency dividing circuit 103 is represented by $-V_{inj} COS(2\omega t)$ and the second frequency dividing circuit 103 operates in the same manner as the above-mentioned first frequency dividing circuit 102. Here, the external clock $\phi_{injx}$ corresponds to a second external clock. Specifically, the mixer 109 of the second frequency dividing circuit 103 multiplies the external clock $\phi_{injx}$ and a second internal feedback signal $V_Q COS(\omega t - \theta \pm \pi/2)$ output by the phase circuit 113, to output $I_{Qmix} COS(\omega t + \theta \pm \pi/2)$.

The adding circuit 111 current-adds $I_{Qmix} COS(\omega t + \theta \pm \pi/2)$ output by the mixer 109 and a second external input signal output by the first coupling circuit 104 and outputs the resultant to the phase circuit 113.

The phase circuit 113 feeds back the clock $V_Q COS(\omega t - \theta \pm \pi/2)$ (second internal feedback signal), which results from the phase shift of the input current, to the mixer 109 and further outputs this clock to the second coupling circuit 105 (second output signal).

Here, for easier understanding of the characteristic of the embodiments, a description will be given in comparison with a clock frequency dividing circuit without any coupling circuit. A clock frequency dividing circuit in FIG. 8 has a first frequency dividing circuit 702 and a second frequency dividing circuit 703. By using the injection lock technique, the first frequency dividing circuit 702 outputs two-phase clocks $\theta_I$ and $\theta_{IX}$ which result from one-half frequency dividing of an external clock $\phi_{inj}$ and synchronize with the external clock $\phi_{inj}$, and the second frequency dividing circuit 703 similarly outputs two-phase clocks $\theta_Q$ and $\theta_{QX}$ which result from one-half frequency dividing of an external clock $\phi_{injx}$ and synchronize with the external clock $\phi_{injx}$.

Figure 8:
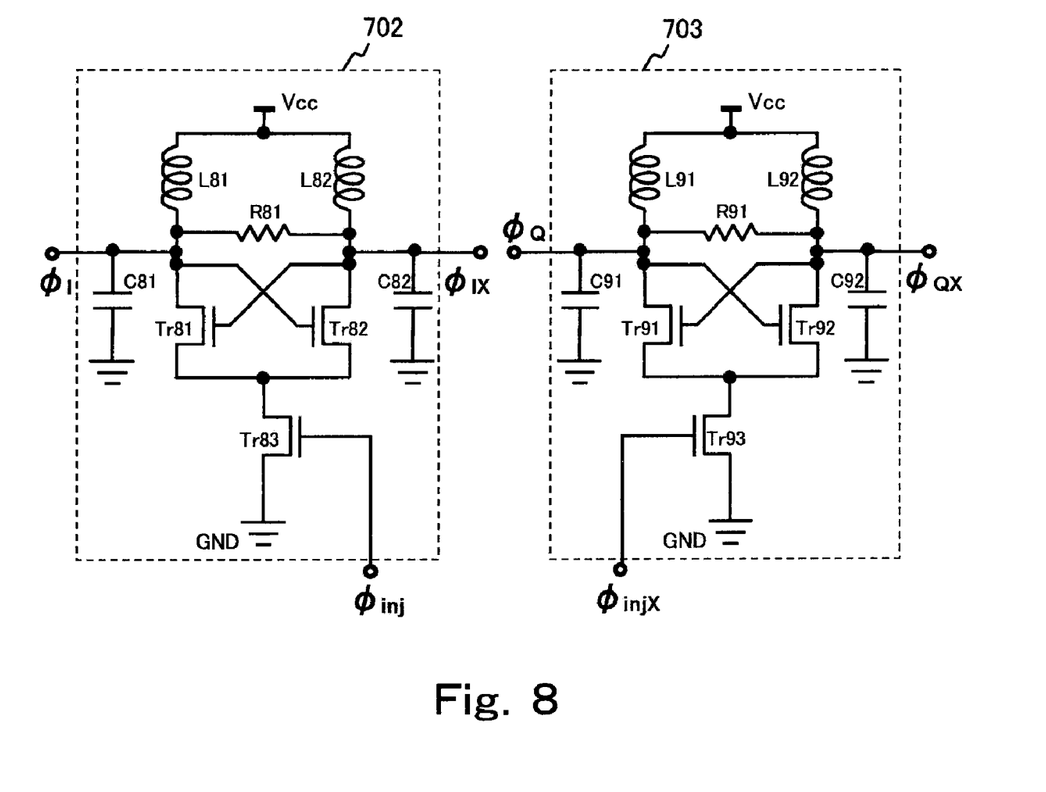
FIG. 8 is a circuit diagram of a clock frequency dividing circuit without any coupling circuit.

In the first frequency dividing circuit 702, coils L81 and L82, a resistor R81, capacitors C81 and C82, and transistors Tr81 to Tr83 form a VCO (voltage controlled oscillator) including an LC oscillator as its base. Vcc represents power supply and GND represents earth.

The second frequency dividing circuit 703, which has the same circuit configuration as that of the first frequency dividing circuit 702, includes coils L91 and L92, a resistor R91, capacitors C91 and C92, and transistors Tr91 to Tr93.

The two-phase external clocks $\phi_{inj}$ and $\phi_{injx}$ each with a frequency 2ω input from an external part are input to the transistor Tr83 of the first frequency dividing circuit 702 and the transistor Tr93 of the second frequency dividing circuit 703 respectively. The transistor Tr83 and the transistor Tr93 vary outputs thereof according to the external clocks $\phi_{inj}$ and $\phi_{injx}$ to control a frequency dividing cycle of a cross coupling circuit including the transistors Tr81 and 82 and a frequency dividing cycle of a cross coupling circuit including the transistors Tr91 and 92.

A LC tank circuit which includes the coils L81 and L82 and the capacitors C81 and C82, and a LC tank circuit which includes the coils L91 and L92 and the capacitors C91 and C92 oscillate with a resonance frequency (self-oscillation frequency) $\omega_0$ which is determined by the coil and capacitive components irrespective of an external part, and output clocks which result from the one-half frequency dividing by the transistors Tr81 to Tr93 and are locked at the frequency ω. However, the following problem occurs because the first frequency dividing circuit 702 and the second frequency circuit 703 are independent of each other.

Specifically, if neither the first coupling circuit 104 nor the second coupling circuit 105 in FIG. 1 is provided, $g_m$=0 in (Expression 1). Hence, the first term and the third term in square root of (Expression 1) are 0, meaning that $I_T$ is smaller than that when the coupling circuits are provided. A decrease in $I_T$ results in a decreased loop gain, which in turn results in a narrow lock range.

The loop gain at this time is given by (Expression 4).

loop gain=$(\beta V_{inj}/2)*|H(\omega)|$ (Expression 4)

Further, without the coupling circuits, the first frequency dividing circuit 102 and the second frequency dividing circuit 103, when receiving the two-phase clocks with the frequency 2ω from the external part, perform the frequency dividing operation independently of each other since $g_m$=0. That is, a phase difference $(\phi_I-\phi_Q)$ between the clocks $\phi_I$ and $\phi_Q$ generated by the first frequency dividing circuit 102 and the second frequency dividing circuit 103 is $+\pi/2$ or $-\pi/2$ depending on an initial state of circuit components included in the frequency dividing circuits and thus is not constant.

On the other hand, in the present embodiment in FIG. 1, the first coupling circuit 104 and the second coupling circuit 105 couple the first frequency dividing circuit 102 and the second frequency dividing circuit 103 to each other in loop shape, and therefore, $g_m$>0. Hence, the phase difference $(\phi_I-\phi_Q)$ between the clocks $\phi_I$ and $\phi_Q$ generated by the first frequency dividing circuit 102 and the second frequency dividing circuit 103 is necessarily determined as follows irrespective of the initial state of the circuit components included in the frequency dividing circuits.

phase difference$(\phi_I-\phi_Q)=-\pi/2(\omega>\omega_0)$ (Expression 5)

phase difference$(\phi_I-\phi_Q)=+\pi/2(\omega<\omega_0)$ (Expression 6)

Here, $\omega_0$ is a resonance angular frequency of the phase circuits 112 and 113.

Figure 2:
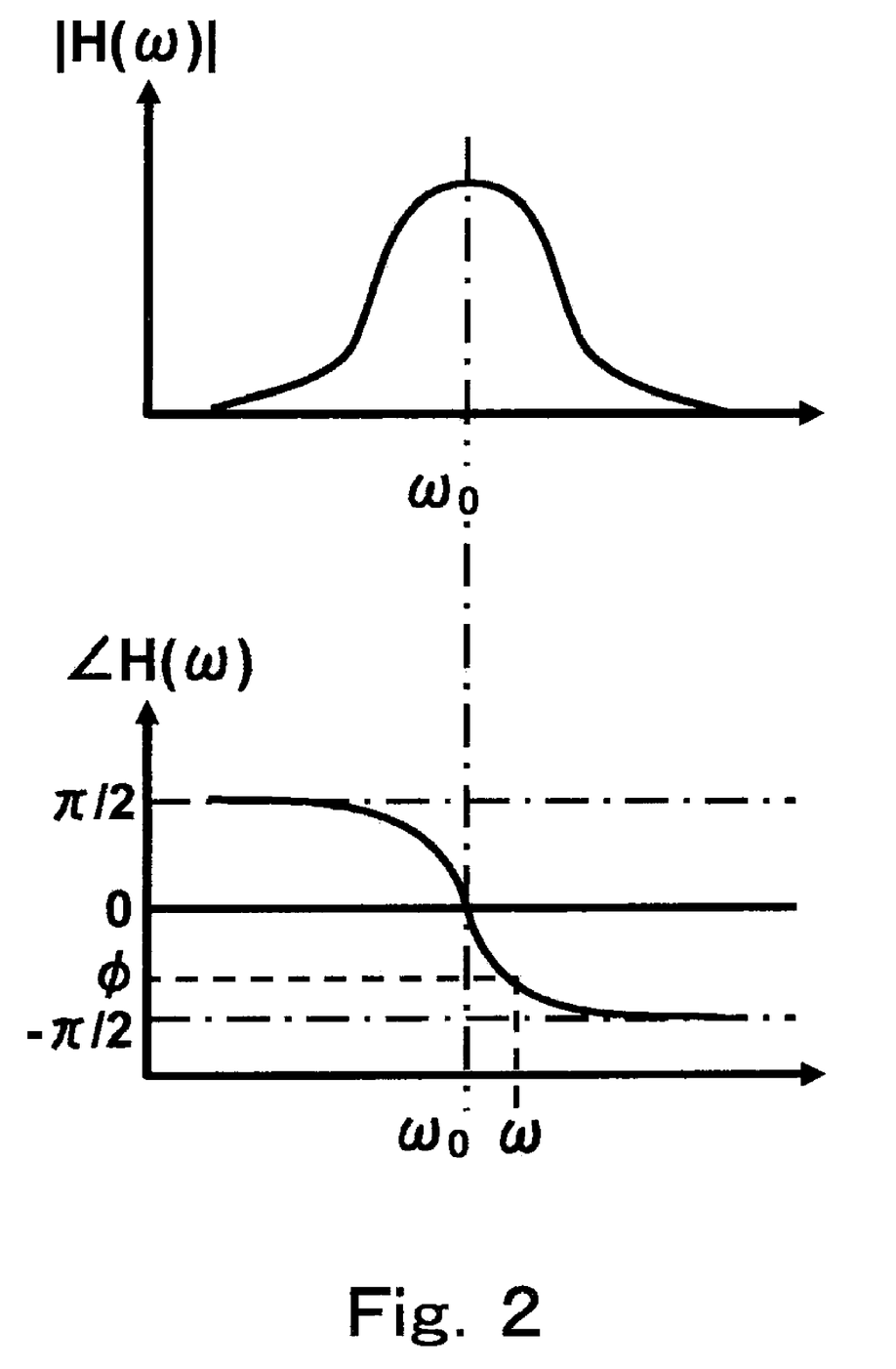
FIG. 2 is an explanatory chart showing a characteristic of a phase circuit of the clock frequency dividing circuit.

FIG. 2 shows a characteristic of a transfer function $H(\omega)$ of a phase circuit formed by the phase circuits 112 and 113. In the transfer function $H(\omega)$, a sign of a phase shift φ by the phase circuit is minus when $\omega>\omega_0$. On the other hand, when $\omega<\omega_0$, the sign of the phase shift φ is plus, and therefore, the relations of (Expression 5) and (Expression 6) hold.

Figure 3A:
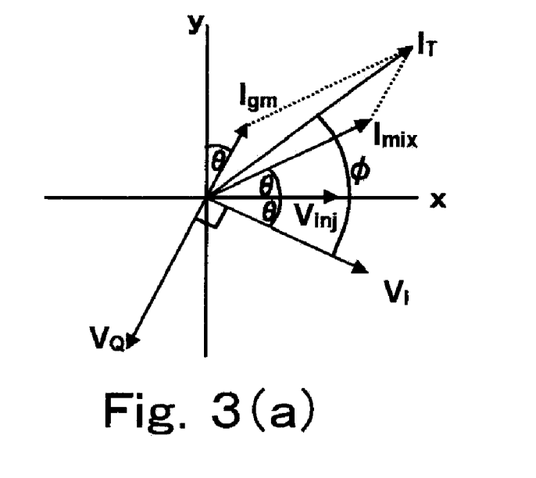
FIG. 3(a) to FIG. 3(c) are explanatory charts showing phase relations of voltage and current of the clock frequency dividing circuit.
Figure 3B:
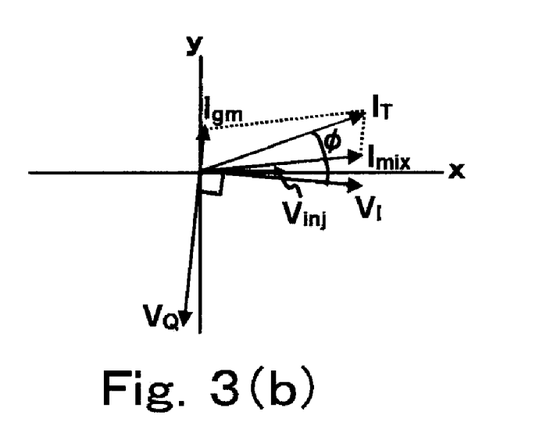
Figure 3C:
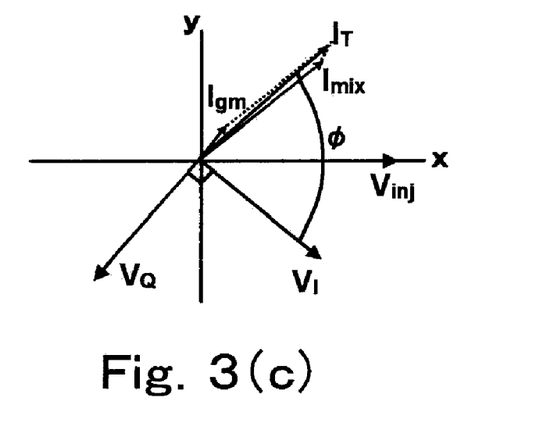

Next, the phase relation of voltage and current in each part of the clock frequency dividing circuit 101 will be described. FIG. 3(a) to FIG. 3(c) show how a phase difference between $V_I$ and $I_{mix}$ changes depending on the magnitude of a component $V_{inj}$ of the external clocks $\phi_{inj}$ and $\phi_{injx}$.

In FIG. 3(a), when $V_I$ has a -θ phase relative to $V_{inj}$, the output $I_{mix}$ of the mixer 108 has a +θ phase relative to $V_{inj}$. That is, a phase difference between the $V_I$ component and the $I_{mix}$ component is 2θ. Further, a clock component $I_{gm}$ fed back from the second frequency dividing circuit 103 via the second coupling circuit 105 is inverted $V_Q$, and thus is different in phase from $V_Q$ by π. Further, relative to $V_I$, $V_Q$ is orthogonal and thus has a π/2 phase difference, and $I_{gm}$ has a -θ phase relative to the y axis.

Since the adding circuit 110 current-adds the $I_{mix}$ component and the $I_{gm}$ component, the two vectors are synthesized, so that the $I_T$ component is obtained. Since the phase circuit 112 phase-shifts the $I_T$ component by φ to output the $V_I$ component, a phase difference between the $I_T$ component and the $V_I$ component is φ.

FIG. 3(b) shows a phase relation between a voltage component and a current component of each part when the injection clock component $V_{inj}$ of the external clocks $\phi_{inj}$ and $\phi_{injx}$ is small. When $V_{inj}$ is small, a phase difference between $V_I$ and $I_{mix}$ is small, and as $V_{inj}$ gets smaller, the phase difference approximates 0. Specifically, θ in FIG. 3(a) decreases and the phase difference between the $I_{mix}$ component and the $I_{gm}$ component increases, so that the $I_T$ component output by the adding circuit 110 decreases. In (Expression 2), when the $I_T$ component gets smaller, the loop gain gets smaller, resulting in a narrower lock range.

In this case, since the phase difference between $V_I$ and $I_{mix}$ decreases, it can be thought that $\omega \approx \omega_0$. Therefore, the phase shift φ by the phase circuits 112 and 113 becomes smaller as well in the characteristic in FIG. 2. Therefore, the phase difference between the output current $I_{gm}$ of the second coupling circuit 105 and the output current $I_{mix}$ of the mixer 108 is about π/2 as shown in FIG. 3(b).

Here, the output current $I_{gm}$ of the second coupling circuit 105 works to change a reactance component of the phase circuit 112. That is, when $\omega>\omega_0$, it operates to increase the resonance frequency $\omega_0$ of the phase circuit 112, while operating to decrease the resonance frequency $\omega_0$ of the phase circuit 112 when $\omega<\omega_0$.

FIG. 3(c) shows a phase relation between the voltage component and the current component of each part when the injection clock component $V_{inj}$ of the external clocks $\phi_{inj}$ and $\phi_{injx}$ is large. When $V_{inj}$ is large, the phase difference between $V_I$ and $I_{mix}$ is large. Specifically, φ in FIG. 3(a) increases and the phase difference between the $V_{mix}$ component and the $I_{gm}$ component decreases, resulting in an increase in the $I_T$ component output by the adding circuit 110. In (Expression 2), an increase in the $I_T$ component increases the loop gain, resulting in a wider lock range.

In this case, the phase difference between $V_I$ and $I_{mix}$ increases and a difference between $\omega$ and $\omega_0$ increases as well. In the characteristic in FIG. 2, when $\omega > \omega_0$, the phase shift $\phi$ approximates $-\pi/2$, and when $\omega < \omega_0$, the phase shift $\theta$ approximates $+\pi/2$. Therefore, the phase difference between the output current $I_{gm}$ of the second coupling circuit 105 and the output current $I_{mix}$ of the mixer 108 becomes substantially 0 as shown in FIG. 3(c), so that the $I_T$ component becomes largest. That is, when $V_{inj}$ is large, the lock range is widened.

As described above, in the clock frequency dividing circuit according to the present embodiment, since the first coupling circuit 104 and the second coupling circuit 105 couple the first frequency dividing circuit 102 and the second frequency circuit 103 to each other in loop shape, the loop gain becomes higher and the lock range can be wider than those in the case without any coupling circuit. Further, since the phase difference between the clocks $\phi_I$ and $\phi_Q$ generated by the first frequency dividing circuit 102 and the second frequency dividing circuit 103 is determined irrespective of the initial state of the circuit components included in the frequency dividing circuits, it is possible to constantly generate four-phase clocks with phase guarantee.

Next, a concrete circuit configuration of the block diagram of the clock frequency dividing circuit according to the present embodiment in FIG. 1 will be described.

Figure 4A:
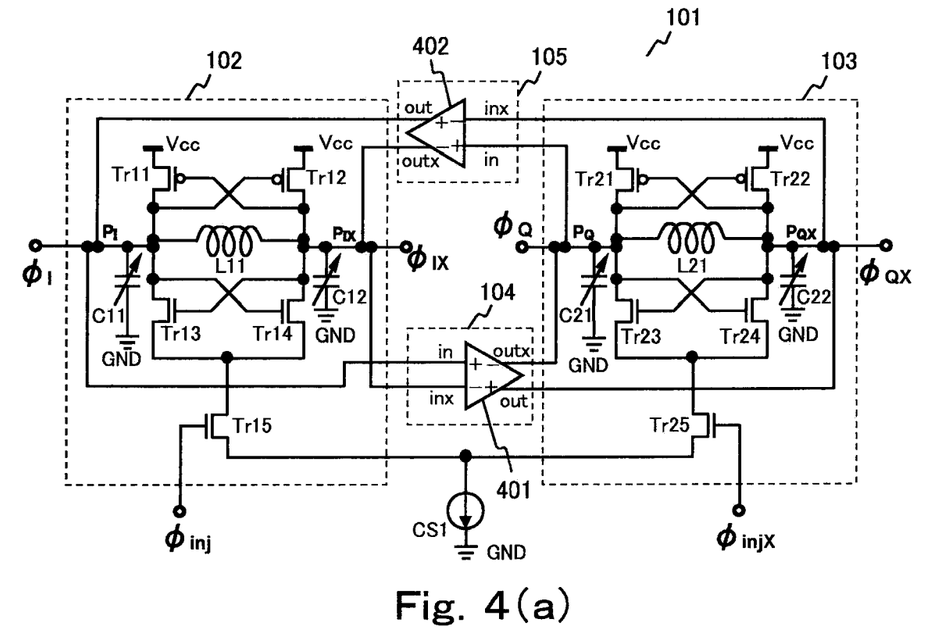
FIG. 4(a) and FIG. 4(b) are circuit diagrams of a first embodiment.

FIG. 4(a) shows a circuit diagram of the clock frequency dividing circuit shown in FIG. 1. The first embodiment uses a VCO including a LC oscillator, as each of the mixers 108 and 109 in FIG. 1.

The first frequency dividing circuit 102 includes transistors Tr11 to Tr15, a coil L11, and variable capacitors C11 and C12. Similarly, the second frequency dividing circuit 103 includes transistors Tr21 to Tr25, a coil L21, and variable capacitors C21 and C22. Further, a current source CS1 supplying current to these frequency dividing circuits are coupled to Tr15 and Tr25. Vcc represents power supply and GND represents earth.

First, the operation of the first frequency dividing circuit 102 will be described.

The external clock $\phi_{inj}$ is input to a gate of Tr15, and electric potentials of connection points $P_I$ and $P_{IX}$ are changed according to a change in the external clock $\phi_{inj}$, so that the angular frequency $2\omega$ of the external clock $\phi_{inj}$ is two-divided into the angular frequency $\omega$.

Tr11 to Tr14, L11, C11, and C12 form the LC oscillator, and in a state where the external clock $\phi_{inj}$ is not input, the LC oscillator oscillates with the resonance angular frequency $\omega_0$ which is determined by L11, C11, and C12. Here, the connection points P and $P_{IX}$ correspond to the adding circuit 110 in FIG. 1, and a LC tank circuit made up of L11, C11, and C12 corresponds to the phase circuit 112 in FIG. 1. A VCO made up of Tr11 to Tr15 and the LC oscillator corresponds to the mixer 108 in FIG. 1.

The second frequency dividing circuit 103 operates similarly to the first frequency dividing circuit 102 since they have the same structure, except in that the phase of the external clock $\phi_{injx}$ is different. That is, connection points $P_Q$ and $P_{QX}$ correspond to the adding circuit 111 in FIG. 1, and a LC tank circuit made up of L21, C21, and C22 corresponds to the phase circuit 113 in FIG. 1. Further, a VCO made up of Tr21 to Tr25 and a LC oscillator corresponds to the mixer 109 in FIG. 1.

Here, depending on the magnitude relation between the resonance angular frequency $\omega_0$ and the angular frequency $\omega$ resulting from the frequency dividing of the angular frequency $2\omega$ of the external clocks $\phi_{inj}$ and $\phi_{injx}$, the phase difference ($\phi_I - \phi_Q$) between the clocks $\phi_I$ and $\phi_Q$ generated by the first frequency dividing circuit 102 and the second frequency dividing circuit 103 is determined as described in (Expression 5) and (Expression 6), and the I-side clocks $\phi_I$ and $\phi_{IX}$ among the four-phase clocks are output from the first frequency dividing circuit 102, and the Q-side clocks $\phi_Q$ and $\phi_{QX}$ among the four-phase clocks are output from the second frequency dividing circuit 103.

Next, the circuit configurations of the first coupling circuit 104 and the second coupling circuit 105 will be described.

Figure 4B:
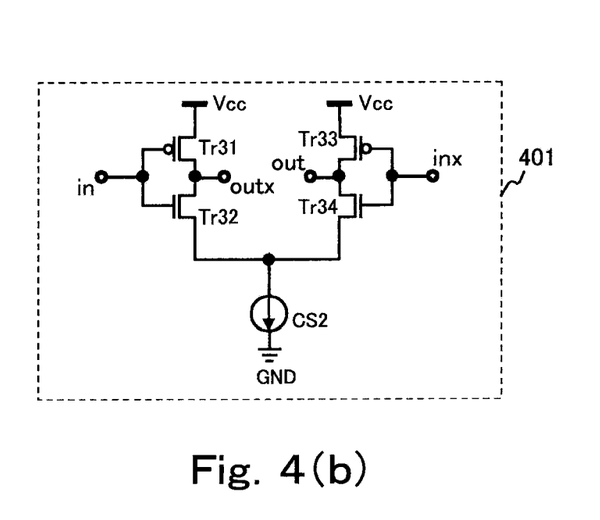

FIG. 4(b) shows a circuit example of a transconductance amplifier 401 included in the first coupling circuit 104. A transconductance amplifier 402 included in the second coupling circuit 105 can have the same circuit.

The transconductance amplifier 401 is a circuit in which a current source CS2 is coupled to an nMOS source node of differential inverters. Tr31 and Tr32 form an inverter, and the inverter inverts a signal which is input via an input in, to output the resultant signal to an output outx. Similarly, Tr33 and Tr34 form an inverter, and the inverter inverts a signal which is input via an input inx, to output the resultant signal to an output out.

Therefore, in FIG. 4(a), the output clock $\phi_I$ of the first frequency dividing circuit 102 is input to the input in of the transconductance amplifier 401 of the first coupling circuit 104, and the inverted signal at the output outx is input to the connection point $P_Q$ of the second frequency dividing circuit 103. The output clock $\phi_{IX}$ of the first frequency dividing circuit 102 is input to the input inx of the first coupling circuit 104, and the inverted signal at the output out is input to the connection point $P_{QX}$ of the second frequency dividing circuit 103.

Similarly, the output clock $\phi_Q$ of the second frequency dividing circuit 103 is input to the input in of the transconductance amplifier 402 of the second coupling circuit 105, and the inverted signal at the output outx is input to the connection point $P_{IX}$ of the first frequency dividing circuit 102. The output clock $\phi_{QX}$ of the second frequency dividing circuit 103 is input to the input inx of the second coupling circuit 105, and the inverted signal at the output out is input to the connection point $P_I$ of the first frequency dividing circuit 102.

That is, the transconductance amplifier 401 of the first coupling circuit 104 coupling the first frequency dividing circuit 102 to the second frequency dividing circuit 103 outputs the clock $\phi_I$ to $\phi_Q$ and outputs the clock $\phi_{IX}$, which is the complementary signal of the clock $\phi_I$, to the clock $\phi_{QX}$ which is the complementary signal of $\phi_Q$. Further, the transconductance amplifier 402 of the second coupling circuit 105 coupling the second frequency dividing circuit 103 to the first frequency dividing circuit 102 outputs the clock $\phi_Q$ to the clock $\phi_{IX}$ and outputs the clock $\phi_{QX}$ to the clock $\phi_I$. Here, since a single-ended structure is shown in FIG. 1, FIG. 1 shows that the clock $\phi_Q$ is coupled to the clock $\phi_{IX}$ which is the complementary signal, and the clock $\phi_{QX}$ which is the complementary signal is coupled to the clock $\phi_I$, as described above, after the clocks $\phi_Q$ and clock $\phi_{QX}$ are multiplied by $-1$ to be phase-shifted by 180 degrees in the reversing part 116. That is, the complementary signals are shown in FIG. 4(a) and thus the transconductance amplifier 402 in FIG. 4(a) realizes both the transconductance $g_m$ 115 and the reversing part 116 in FIG. 1.

Figure 6A:
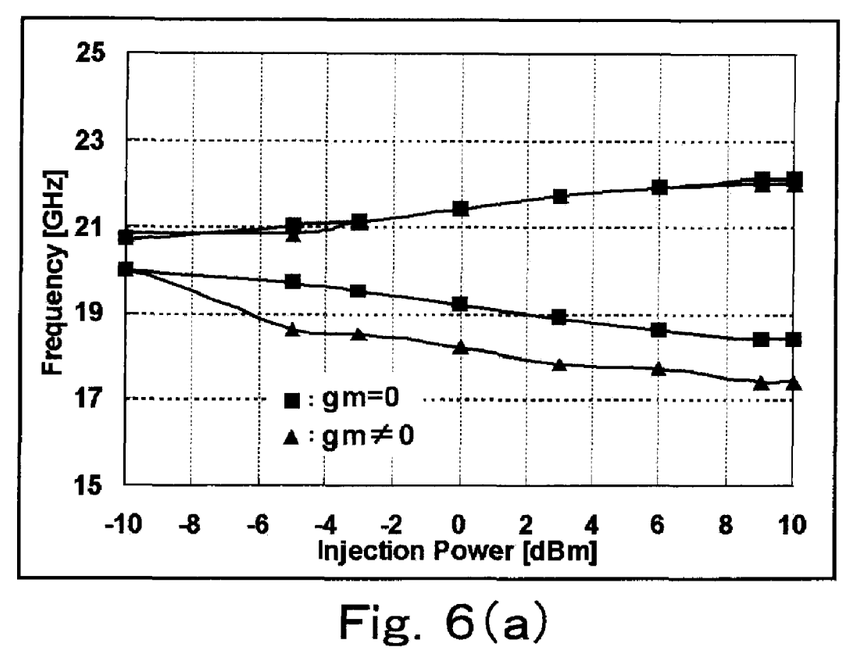
FIG. 6(a) and FIG. 6(b) are graphs showing effects of the first and second embodiments respectively.

Here, effects of this embodiment will be described. FIG. 6(a) is a graph showing simulation results of the clock frequency dividing circuit of the first embodiment ($g_m \neq 0$) and the clock frequency dividing circuit without any coupling circuit ($g_m = 0$). The horizontal axis shows energy of the external clock $\phi_{inj}$ (injection power), and the vertical axis shows the upper limit and the lower limit of the lock frequency. The width of the upper limit and the lower limit of the lock frequency is a lock range. The larger the injection power is, the larger the input amplitude is, resulting in a wider lock range. It is seen that, when the first frequency dividing circuit 102 and the second frequency dividing circuit 103 are coupled ($g_m \neq 0$), the lock range is wider by about 1 GHz than when they are not coupled ($g_m = 0$).

As described above, in the first embodiment, each of the mixers 108 and 109 in the first frequency dividing circuit 102 and the second frequency dividing circuit 103 is the VCO including the LC oscillator as its base, which makes it possible to realize a clock frequency dividing circuit with a simple circuit and with a wide lock range.

Further, the phase difference between the generated clocks $\phi_I$ and $\phi_Q$ is determined depending on the magnitude relation between $\omega$ and $\omega_0$ as shown by (Expression 5) and (Expression 6) irrespective of the initial state of the circuit components included in the first frequency dividing circuit 102 and the second frequency dividing circuit 103, and therefore it is possible to constantly generate stable four-phase clocks with phase guarantee.

Figure 5:
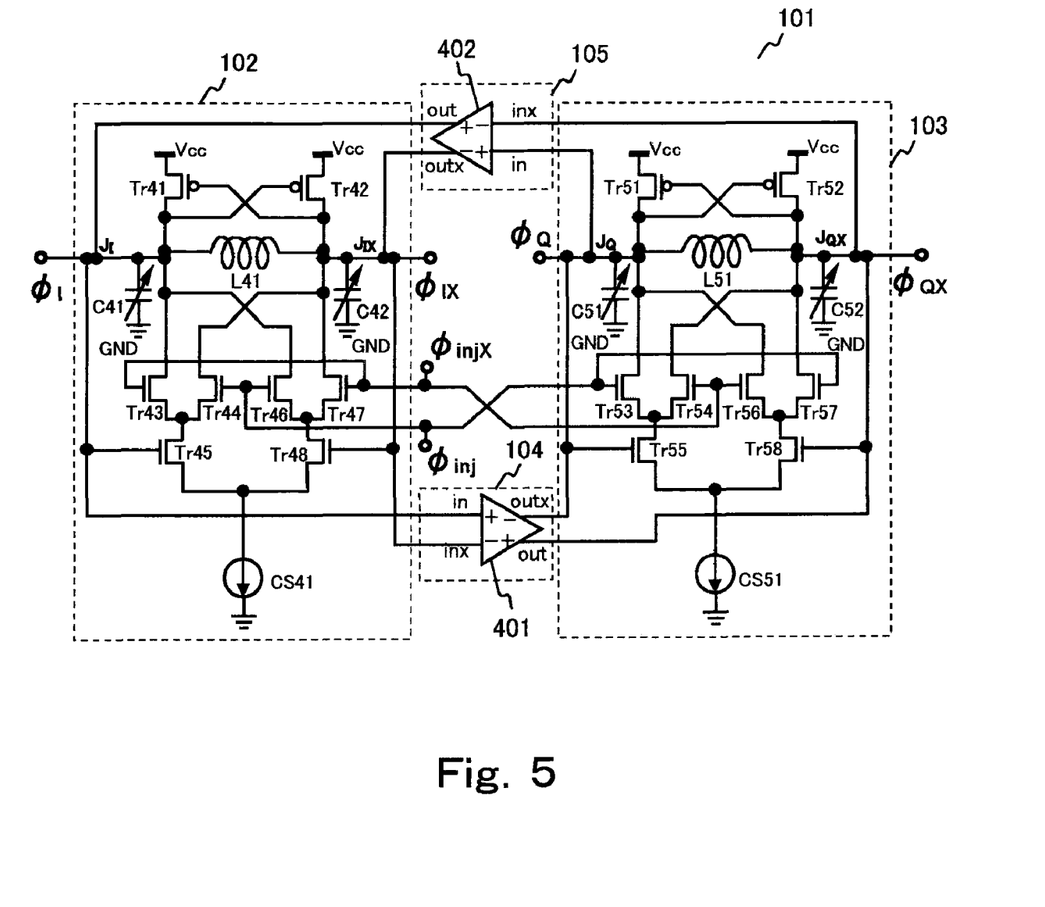
FIG. 5 is a circuit diagram of a second embodiment.

FIG. 5 shows a circuit diagram of the clock frequency dividing circuit shown in FIG. 1. In the first embodiment, each of the mixers 108 and 109 is the VCO including the LC oscillator as its base, but in the second embodiment, an analog multiplication circuit is used as each of the mixers 108 and 109.

The first frequency dividing circuit 102 includes transistors Tr41 to Tr48, a coil L41, variable capacitors C41 and C42, and a current source CS41.

Similarly, the second frequency dividing circuit 103 includes transistors Tr51 to Tr58, a coil L51, variable capacitors C51 and C52, and a current source CS51. Vcc represents power supply and GND represents earth.

Here, Tr43 to Tr48 of the first frequency dividing circuit 102 form an analog multiplier. The analog multiplier is a circuit which multiplies the external clock $\phi_{injx}$ input to gates of Tr43 and Tr47 and the external clock $\phi_{inj}$ input to gates of Tr44 and Tr46 by the complementary clocks $\phi_I$ and $\phi_{IX}$ input to gates of Tr45 and Tr48, and is known as a gilbert cell type. Similarly, Tr53 to Tr58 of the second frequency dividing circuit 103 form an analog multiplier.

L41, C41, and C42, which form a LC tank circuit, and Tr41 and Tr42 form a LC oscillator, and without any analog multiplier, the LC oscillator oscillates with the resonance angular frequency $\omega_0$ which is determined by L41, C41, and C42. Here, connection points $J_I$ and $J_{IX}$ correspond to the adding circuit 110 in FIG. 1, and the LC tank circuit corresponds to the phase circuit 112 in FIG. 1. The analog multiplier formed by Tr43 to Tr48 corresponds to the mixer 108 in FIG. 1. Similarly, L51, C51, and C52, which form a LC tank circuit, and Tr51 and Tr52 form a LC oscillator in the second frequency dividing circuit 103.

In the first frequency dividing circuit 102, the analog multiplier multiplies the external clocks $\phi_{inj}$ and $\phi_{injx}$ and the output clocks $\phi_I$ and $\phi_{IX}$ which are internally fed back (first internal feedback signal), so that clocks with a sum frequency and a difference frequency are generated. The outputs of the analog multiplier are input to the LC tank circuit, undergo the filtering of their harmonic components there, and are shifted by a phase determined by FIG. 2(a) to FIG. 2(c), according to the magnitude relation between the resonance angular frequency $\omega_0$ and the angular frequency component $\omega$ of the outputs of the analog multiplier, so that the clocks $\phi_I$ and $\phi_{IX}$ are output.

Similarly, in the second frequency dividing circuit 103, the external clocks $\phi_{inj}$ and $\phi_{injx}$ and the output clocks $\phi_Q$ and $\phi_{QX}$ which are internally fed back (second internal feedback signal) are multiplied, and the resultants are phase-shifted by the LC tank circuit, so that the clocks $\phi_Q$ and $\phi_{QX}$ are output.

Here, depending on the magnitude relation between the resonance angular frequency $\omega_0$ and the angular frequency $\omega$ resulting from the frequency dividing of the angular frequency $2\omega$ of the external clocks $\phi_{inj}$ and $\phi_{injx}$, the phase difference ($\phi_I - \phi_Q$) between the clocks $\phi_I$ and $\phi_Q$ generated by the first frequency dividing circuit 102 and the second frequency dividing circuit 103 is determined as described in (Expression 5) and (Expression 6).

Further, the circuit configuration of the first coupling circuit 104 and the second coupling circuit 105 can be the same as that in FIG. 4(b) described in the first embodiment.

Specifically, in the first coupling circuit 104 coupling the first frequency dividing circuit 102 to the second frequency dividing circuit 103, the transconductance amplifier 401 outputs the clock $\phi_I$ to $\phi_Q$ and outputs the complementary clock $\phi_{IX}$ of the clock $\phi_I$ to the complementary clock $\phi_{QX}$ of $\phi_Q$. Further, in the second coupling circuit 105 coupling the second frequency dividing circuit 103 to the first frequency dividing circuit 102, the transconductance amplifier 402 outputs the clock f to the complementary clock $\phi_{IX}$ of $\phi_I$ and outputs the complementary clock $\phi_X$ of the clock $\phi_Q$ to $\phi_1$.

In this manner, as in the first embodiment, the first frequency dividing circuit 102 and the second frequency dividing circuit 103 are coupled to each other in loop shape via the first coupling circuit 104 including the transconductance amplifier 401 and the second coupling circuit 105 including the transconductance amplifier 402, so that the loop gain increases, which makes it possible to widen the lock range.

Figure 6B:
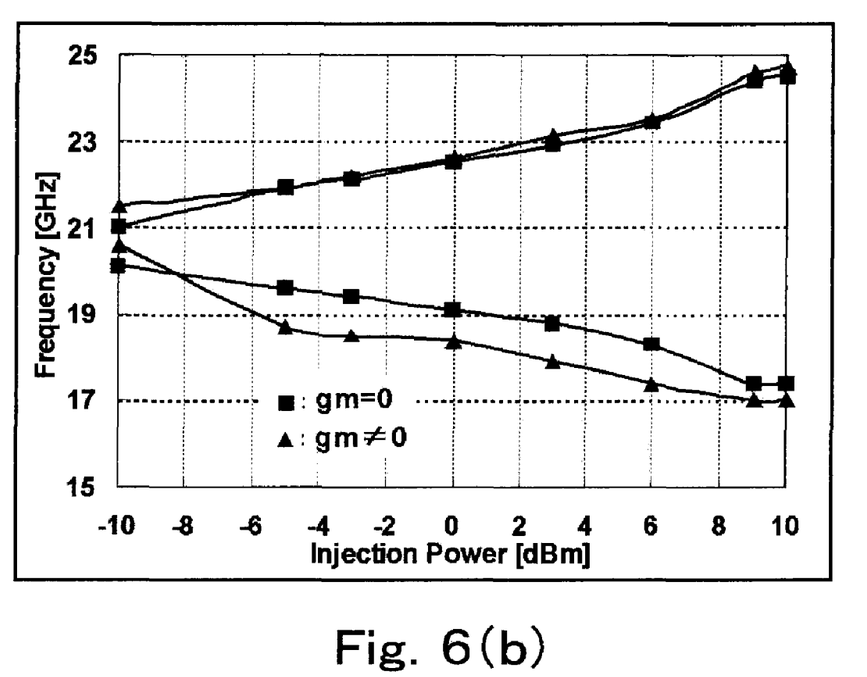

Here, effects of this embodiment will be described. FIG. 6(b) is a graph showing simulation results of the clock frequency dividing circuit of the second embodiment ($g_m \neq 0$) and the clock frequency dividing circuit without any coupling circuit ($g_m = 0$). As in FIG. 6(a), the larger the injection power is, the wider the lock range is, and the width between the upper limit and the lower limit of the lock frequency is larger and thus the lock range about twice as large is obtained, compared with the first embodiment.

In the foregoing second embodiment, the use of the analog multipliers as the mixers 108 and 109 in the first frequency dividing circuit 102 and the second frequency dividing circuit 103 makes it possible to realize a clock frequency dividing circuit with a wider lock range.

Further, the phase difference ($\phi_I - \phi_Q$) between the generated clocks $\phi_I$ and $\phi_Q$ is determined depending on the magnitude relation between $\omega$ and $\omega_0$, irrespective of the initial state of the circuit components included in the first frequency dividing circuit 102 and the second frequency dividing circuit 103, and therefore, it is possible to realize a clock frequency dividing circuit which is capable of constantly generating stable four-phase clocks with phase guarantee.

Figure 7A:
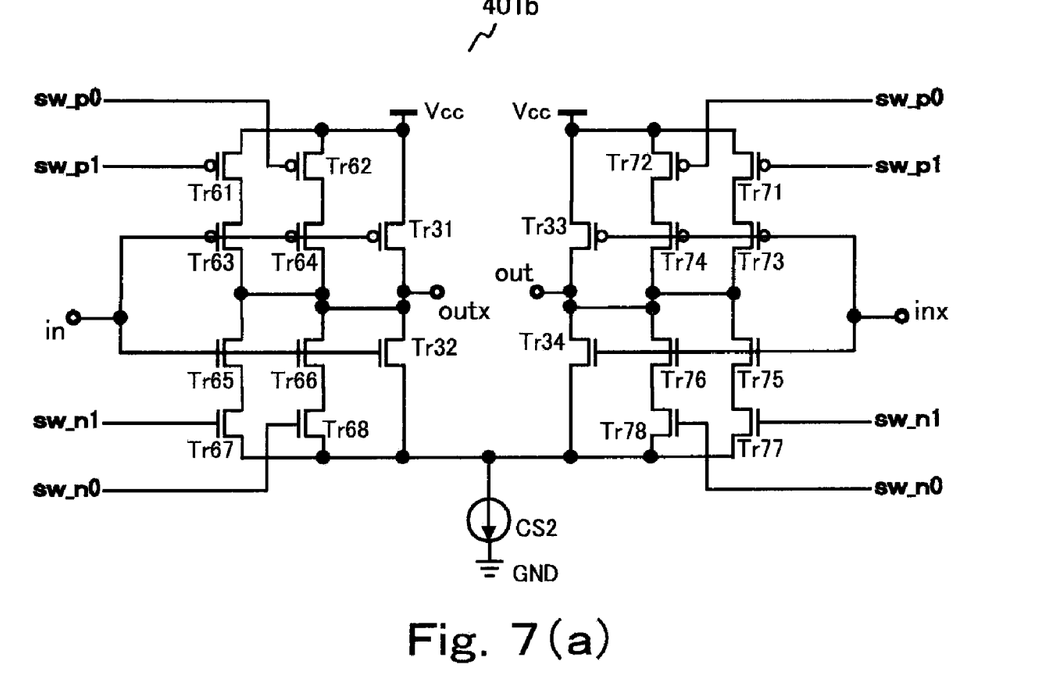
FIG. 7(a) and FIG. 7(b) are circuit diagrams of a third embodiment.
Figure 7B:
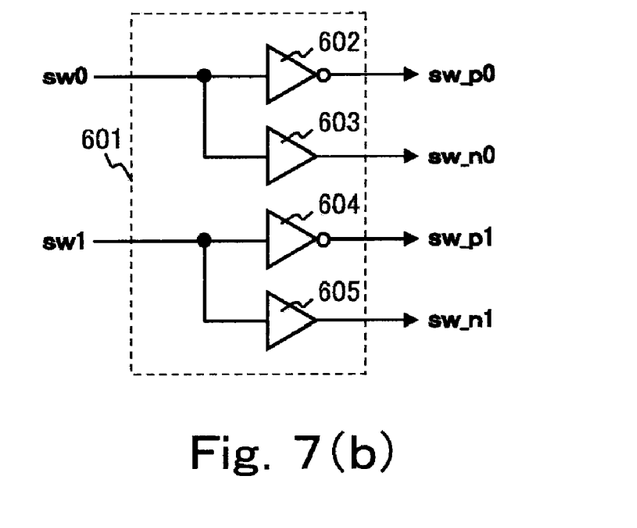

Next, a third embodiment will be described. FIG. 7(a) and FIG. 7(b) show a transconductance amplifier 401b of the clock frequency dividing circuit which is different from the transconductance amplifier 401 in the first embodiment and the second embodiment in that its gain is externally variable.

FIG. 7(a) is a circuit diagram of the transconductance amplifier 401b, and FIG. 7(b) is a circuit diagram of a gain control signal generation part. The same reference numerals and symbols as those in the transconductance amplifier 401 in FIG. 4(b) denote the same components. Further, the transconductance amplifier 402 of the second coupling circuit 105 can have the same configuration as that of the transconductance amplifier 401b. Both of or one of the first coupling circuit 104 and the second coupling circuit 105 may have the configuration of the transconductance amplifier 401b.

Tr61 to 64 and Tr71 to 74 are pMOS transistors, and Tr65 to 68 and Tr75 to 78 are nMOS transistors.

A pair of serially coupled Tr61 and Tr63 and a pair of serially coupled Tr62 and Tr64 are coupled to Tr31 in parallel. Therefore, when a control signal sw_p0 becomes low level, Tr62 turns on, and when sw_p1 becomes low level, Tr61 turns on. When one of Tr62 and Tr61 turns on, a ratio of a signal at the output outx to a signal at the input in is twice as high as that when only Tr31 turns on. That is, the gain is increased to widen the lock range.

When Tr62 and Tr61 both turn on, the ratio of the signal at the output outx to the signal at the input in is three times as high as that when only Tr31 turns on. That is, the gain further increases to further widen the lock range.

Similarly, a pair of serially coupled Tr71 and Tr73 and a pair of serially coupled Tr72 and Tr74 are coupled to Tr33 in parallel. Therefore, when the control signal sw_p0 becomes low level, Tr72 turns on, and when sw_p1 becomes low level, Tr71 turns on. Depending on the ON state of Tr72 and Tr71, as in the case of Tr62 and Tr61, the gain can be controlled, enabling the variation of the lock range.

The nMOS transistors Tr65 to 68 are controlled by control signals sw_n0 and sw_n1. Specifically, a pair of serially coupled Tr65 and Tr67 and a pair of serially coupled Tr66 and Tr68 are coupled to Tr32 in parallel. Therefore, when the control signal sw_n0 becomes high level, Tr68 turns on, and when sw_n1 becomes high level, Tr67 turns on. As in the case of Tr62 and Tr61, the gain can be controlled depending on the ON state of Tr67 and Tr68, which enables the variation of the lock range, though the logics of the control signals are inverted.

Similarly, a pair of serially coupled Tr75 and Tr77 and a pair of serially coupled Tr76 and Tr78 are coupled to Tr34 in parallel. Therefore, when the control signal sw_n0 becomes high level, Tr78 turns on, and when sw_n1 becomes high level, Tr77 turns on. As in the case of Tr67 and Tr68, depending on the ON state of Tr77 and Tr78, the gain can be controlled, which enables the variation of the lock range.

Here, the control signals sw_p0, sw_p1, sw_n0, sw_n1 can be structured as shown in the gain control signal generation part 601. Assuming that a setting signal from an upper-order circuit (not shown) of the clock frequency dividing circuit has two bits of sw0 and sw1, when sw0 and sw1 are both low level ("0"), the control signal sw_p0 becomes high level and sw_p1 becomes high level as well since sw0 and sw1 are inverted by inverters 602 and 604. On the contrary, since buffers 603 and 605 output sw_n0 and sw_n1 without changing logics of sw0 and sw1, sw_n0 becomes low level and sw_n1 becomes low level as well. As a result, Tr61 and 62, Tr67 and 68, Tr71 and 72, and Tr77 and 78 are all reverse-biased to turn off, so that the coupling circuit 401b is driven only by Tr31 to Tr34. That is, since currents flowing to the outputs out and outx are small and the gain becomes smallest, the lock range becomes narrow according to (Expression 2).

Next, when one of sw0 and sw1 is high level ("1"), for example, when sw0 is high level ("1"), the control signal sw_p0 becomes low level, sw_p1 becomes high level, sw_n0 becomes high level, and sw_n1 becomes low level in the same manner as above, and accordingly Tr62, Tr68, Tr72, and Tr78 turn on, so that one circuit parallel to Tr31 to Tr34 is driven. That is, a slightly higher gain is obtained compared with the case only with Tr31 to Tr34, so that the lock range is widened. The same applies to the case where only sw1 is high level ("1").

Next, when sw0 and sw1 are both high level ("1"), the control signal sw_p0 becomes low level, sw_p1 becomes low level as well, sw_n0 becomes high level, and sw_n1 becomes high level as well, and accordingly all of Tr61 and 62, Tr67 and 68, Tr71 and 72, and Tr77 and 78 turn on in the same manner as above, so that two circuits parallel to Tr31 to Tr34 are driven. That is, a still higher gain is obtained compared with the case only with Tr31 to Tr34, so that the lock range is further widened.

As described above, three-stage adjustment of the gain of the coupling circuit is made possible by the combination of the logics of sw0 and sw1, which enables the variation of the lock range according to application.

Generally, in accordance with an increase in the loop gain, the lock range is widened, but power consumption increases as well. On the other hand, in accordance with a decrease in the loop gain, power consumption decreases, but the lock range is narrowed. Therefore, by making the conductance of the coupling circuit externally controllable, it is possible to vary the loop gain according to the use, which then makes it possible to obtain a necessary lock range while suppressing an increase in power consumption.

Incidentally, in this embodiment, the gain of the transconductance amplifier is adjusted in three stages, but by increasing/decreasing the number of similar circuits, it is possible to realize gain adjustment other than the three-stage gain adjustment. Further, even with other configuration, by using a circuit capable of controlling the gain of the first coupling circuit or the second coupling circuit or capable of controlling the gains of both of the coupling circuits, it is possible to vary the lock range of the clock frequency dividing circuit as in this embodiment.

As described hitherto in the embodiments, the clock frequency dividing circuit according to the embodiments can realize a higher loop gain and as a result, a wider lock range by the structure in which the first frequency dividing circuit and the second frequency dividing circuit are coupled in loop shape by the coupling circuits.

As a result, it is possible to overcome the problem of the injection lock technique which has a drawback of a narrow lock range even though having merits of low power consumption and small phase noise. Accordingly, it is possible to realize a high-accuracy clock frequency dividing circuit with a wide lock range, in a high frequency band ranging from several GHz to several tens GHz.

Further, the clock frequency dividing circuit of the embodiments can guarantee the phase relation of the four-phase clocks that it outputs, by linking the first frequency dividing circuit and the second frequency dividing circuit with each other.

Further, by controlling the gain(s) of one of or both of the first coupling circuit and the second coupling circuit, it is possible to vary the lock range according to application.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A clock frequency dividing circuit comprising:
a first frequency dividing circuit having a first mixer multiplying a first external clock and a first internal feedback signal, a first adding circuit adding an output of the first mixer and a first external input signal, and a first phase circuit phase-shifting an output of the first adding circuit to output a first output signal and the first internal feedback signal;
a second frequency dividing circuit having a second mixer multiplying a second external clock and a second internal feedback signal, a second adding circuit adding an output of the second mixer and a second external input signal, and a second phase circuit phase-shifting an output of the second adding circuit to output a second output signal and the second internal feedback signal;
a first coupling circuit receiving the first output signal of the first frequency dividing circuit to output the second external input signal; and
a second coupling circuit receiving the second output signal of the second frequency dividing circuit to output the first external input signal, wherein
the first coupling circuit includes a first transconductance amplifier, and the second coupling circuit includes a second transconductance amplifier.

2. The clock frequency dividing circuit according to claim 1, wherein
at least one of the first mixer and the second mixer is a VCO including a LC oscillation circuit.

3. The clock frequency dividing circuit according to claim 1, wherein
at least one of the first mixer and the second mixer is an analog multiplication circuit.

4. The clock frequency dividing circuit according to claim 1, further comprising
a gain adjustment part adjusting a gain of the first transconductance amplifier.

5. The clock frequency dividing circuit according to claim 1, further comprising
a gain adjustment part adjusting a gain of the second transconductance amplifier.

6. The clock frequency dividing circuit according to claim 1, further comprising:
a first gain adjustment part adjusting a gain of the first transconductance amplifier; and
a second gain adjustment part adjusting a gain of the second transconductance amplifier.

* * * * *